(12) United States Patent
Toizumi et al.

(10) Patent No.: US 10,750,251 B2
(45) Date of Patent: Aug. 18, 2020

(54) INFORMATION PROVIDING APPARATUS, INFORMATION PROVIDING METHOD, AND STORAGE MEDIUM

(71) Applicant: NEC Corporation, Minato-ku, Tokyo (JP)

(72) Inventors: Takahiro Toizumi, Tokyo (JP); Ryota Suzuki, Tokyo (JP); Eisuke Saneyoshi, Tokyo (JP); Shigeru Koumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 18 days.

(21) Appl. No.: 15/754,366

(22) PCT Filed: Aug. 3, 2016

(86) PCT No.: PCT/JP2016/072760
§ 371 (c)(1),
(2) Date: Feb. 22, 2018

(87) PCT Pub. No.: WO2017/038354
PCT Pub. Date: Mar. 9, 2017

(65) Prior Publication Data
US 2018/0255372 A1    Sep. 6, 2018

(30) Foreign Application Priority Data
Sep. 3, 2015  (JP) ................ 2015-173673

(51) Int. Cl.
*G06F 13/42*    (2006.01)
*H04Q 9/00*    (2006.01)
(Continued)

(52) U.S. Cl.
CPC ............... *H04Q 9/00* (2013.01); *G01R 21/06* (2013.01); *G01R 21/133* (2013.01); *G06N 5/04* (2013.01); *G06N 7/005* (2013.01); *G06N 20/00* (2019.01)

(58) Field of Classification Search
CPC ........ H04Q 9/00; G01R 21/06; G01R 21/133; G06N 5/04
See application file for complete search history.

(56) References Cited

U.S. PATENT DOCUMENTS

| | | | |
|---|---|---|---|
| 6,453,284 B1 * | 9/2002 | Paschall | G10L 21/028 381/94.3 |
| 7,231,019 B2 * | 6/2007 | Pascovici | G10L 17/16 379/88.02 |

(Continued)

FOREIGN PATENT DOCUMENTS

| | | |
|---|---|---|
| JP | 2002-189779 A | 7/2002 |
| JP | 3403368 B2 | 5/2003 |

(Continued)

OTHER PUBLICATIONS

International Search Report for PCT Application No. PCT/JP2016/072760, dated Oct. 18, 2016.

*Primary Examiner* — Quang Pham

(57) ABSTRACT

Provided is an information providing apparatus (10) including a reliability determination unit (11) that determines a reliability of an inference result obtained by inferring an operation state of a monitored electric device group, on the basis of time-series measurement data and training data, the time-series measurement data including any one of current consumption and power consumption of the monitored electric device group and the training data associating each of a plurality of the operation states which can be assumed by the electric device group with a feature value of each of (Continued)

the plurality of operation states, and an output unit (12) that outputs information related to the reliability.

20 Claims, 15 Drawing Sheets

(51) Int. Cl.
    *G01R 21/133*     (2006.01)
    *G06N 7/00*     (2006.01)
    *G01R 21/06*     (2006.01)
    *G06N 5/04*     (2006.01)
    *G06N 20/00*     (2019.01)

(56) References Cited

U.S. PATENT DOCUMENTS

| | | | |
|---|---|---|---|
| 7,363,227 B2 * | 4/2008 | Mapes-Riordan | G10L 21/06 704/273 |
| 8,369,549 B2 * | 2/2013 | Bartkowiak | H04R 25/505 381/312 |
| 8,423,364 B2 * | 4/2013 | Yu | G10L 15/063 704/231 |
| 8,812,427 B2 * | 8/2014 | Kim | G06F 11/3006 706/52 |
| 9,366,704 B2 * | 6/2016 | Haghighat-Kashani | H02J 13/0006 |
| 2013/0036080 A1 * | 2/2013 | Kane-Esrig | A61B 5/165 706/46 |
| 2014/0143189 A1 * | 5/2014 | Matsuyama | G01S 5/0278 706/12 |
| 2015/0046135 A1 * | 2/2015 | Ito | G06N 20/00 703/2 |
| 2016/0132776 A1 * | 5/2016 | Yang | G06Q 30/02 706/46 |

FOREIGN PATENT DOCUMENTS

| | | | |
|---|---|---|---|
| JP | 2006-350920 A | | 12/2006 |
| JP | 2010-205114 A | | 9/2010 |
| JP | 2010205114 A | * | 9/2010 |
| JP | 2014-021555 A | | 2/2014 |

* cited by examiner

FIG. 3

| MONITORED ELECTRIC DEVICE | FEATURE VALUE |
|---|---|
| MONITOR | ... |
| P C | ... |
| FIXED-LINE PHONE | ... |
| ⋮ | ⋮ |

FIG. 4

| OPERATION STATE | CONTENTS | FEATURE VALUE |
|---|---|---|
| 1-1 | FIXED-LINE PHONE ○○ W | ... |
| 1-2 | FIXED-LINE PHONE × × W | ... |
| ⋮ | ⋮ | ⋮ |
| 1-10 | FIXED-LINE PHONE ○○ W, PC ×△ W, MONITOR ○ × W | ... |
| ⋮ | ⋮ | ⋮ |

FIG. 5

| DATE | TIME | INFERENCE RESULT | EXTRACTED FEATURE VALUE |
|---|---|---|---|
| 20150701 | 0:00:00~0:00:30 | 1-1 | ... |
| 20150701 | 0:00:30~0:01:00 | 1-1 | ... |
| ⋮ | ⋮ | ⋮ | ⋮ |
| 20150701 | 10:43:00~10:43:30 | 1-10 | ... |
| ⋮ | ⋮ | ⋮ | ⋮ |

FIG. 9

| DATE | TIME | INFERENCE RESULT | RELIABILITY |
|---|---|---|---|
| 20150701 | 0:00:00～0:00:30 | 1-1 | 100 % |
| 20150701 | 0:00:30～0:01:00 | 1-1 | 100 % |
| ⋮ | ⋮ | ⋮ | ⋮ |
| 20150701 | 10:43:00～10:43:30 | 1-10 | 97 % |
| ⋮ | ⋮ | ⋮ | ⋮ |

INFORMATION PROVIDING APPARATUS, INFORMATION PROVIDING METHOD, AND STORAGE MEDIUM

This application is a National Stage Entry of PCT/JP2016/072760 filed on Aug. 3, 2016, which claims priority from Japanese Patent Application 2015-173673 filed on Sep. 3, 2015, the contents of all of which are incorporated herein by reference, in their entirety.

TECHNICAL FIELD

The present invention relates to an information providing apparatus, an information providing method, and a program.

BACKGROUND ART

Patent Document 1 discloses a technique for extracting a feature value from measurement data detected by a measurement sensor which is installed in the vicinity of a feeder inlet, and inferring an operation state of an electric device group on the basis of the feature value.

RELATED DOCUMENT

Patent Document

[Patent Document 1] Japanese Patent No. 3403368

SUMMARY OF THE INVENTION

Technical Problem

In the inference technique disclosed in Patent Document 1, the state of the electric device group is inferred on the basis of the feature value extracted from the measurement data. However, there have been problems that when training data associating the feature value with the operation state of the electric device group is not appropriately set, the inference accuracy related to the state of the electric device group becomes deteriorated, and whether the training data has been appropriately set could not be checked.

Solution to Problem

According to the invention, there is provided an information providing apparatus including: a reliability determination unit that determines a reliability of an inference result indicating an operation state of a monitored electric device group obtained by performing an inference on the basis of time-series measurement data and training data, the time-series measurement data including any one of current consumption and power consumption of the monitored electric device group and the training data associating each of a plurality of the operation states which can be assumed by the monitored electric device group with a feature value of each of the plurality of operation states; and an output unit that outputs information related to the reliability.

In addition, according to the invention, there is provided an information providing method executed by a computer, the method including: a reliability determination step of determining a reliability of an inference result indicating an operation state of a monitored electric device group, the inference result obtained by performing an inference on the basis of time-series measurement data and training data, the time-series measurement data including any one of current consumption and power consumption of the monitored electric device group and the training data associating each of a plurality of the operation states which can be assumed by the electric device group with a feature value of each of the plurality of operation states; and an output step of outputting information related to the reliability.

In addition, according to the invention, there is provided a program causing a computer to function as: a reliability determination unit that determines a reliability of an inference result indicating an operation state of a monitored electric device group, the inference result obtained by performing an inference on the basis of time-series measurement data and training data, the time-series measurement data including any one of current consumption and power consumption of the monitored electric device group and the training data associating each of a plurality of the operation states which can be assumed by the electric device group with a feature value of each of the plurality of operation states; and an output unit that outputs information related to the reliability.

In addition, according to the invention, there is provided an information providing apparatus including: an output unit that outputs a reliability of an inference result indicating an operation state of a monitored electric device group, the inference result obtained by performing an inference on the basis of time-series measurement data and training data, the time-series measurement data including any one of current consumption and power consumption of the monitored electric device group and the training data associating each of a plurality of the operation states which can be assumed by the electric device group with a feature value of each of the plurality of operation states.

In addition, according to the invention, there is provided an information providing method executed by a computer, the method including: an output step of outputting a reliability of an inference result indicating an operation state of a monitored electric device group, the inference result obtained by performing an inference on the basis of time-series measurement data and training data, the time-series measurement data including any one of current consumption and power consumption of the monitored electric device group and the training data associating each of a plurality of the operation states which can be assumed by the electric device group with a feature value of each of the plurality of operation states.

In addition, according to the invention, there is provided a program causing a computer to function as: an output unit that outputs a reliability of an inference result indicating an operation state of a monitored electric device group, the inference result obtained by performing an inference on the basis of time-series measurement data and training data, the time-series measurement data including any one of current consumption and power consumption of the monitored electric device group and the training data associating each of a plurality of the operation states which can be assumed by the electric device group with a feature value of each of the plurality of operation states.

Advantageous Effects of Invention

According to the invention, it is possible to easily check whether predetermined training data is correctly set in a system that infers an operation state of an electric device group.

BRIEF DESCRIPTION OF THE DRAWINGS

The above-described objects, other objects, features and advantages will be further apparent from the preferred example embodiments described below, and the accompanying drawings as follows.

FIG. 3 is a schematic diagram illustrating an example of a feature value of each monitored electric device which is registered in advance.

FIG. 4 is a schematic diagram illustrating an example of training data associating an operation state of a monitored electric device group with a feature value.

FIG. 5 is a schematic diagram illustrating an example of result data of operation state inference processing.

FIG. 9 is a schematic diagram illustrating an example of reliability data indicating the reliability of an inference result.

DESCRIPTION OF EMBODIMENTS

First, an example of a hardware configuration of an apparatus (inference apparatus) according to this example embodiment will be described. Units included in the apparatus are implemented by any combination of hardware and software, mainly, a central processing unit (CPU), a memory, a program loaded into the memory, a storage unit (capable of storing programs stored in advance from the shipping stage as well as programs downloaded from a storage medium such as a compact disc (CD), or a server or the like on the Internet) such as a hard disk which stores the program, and an interface for network connection of an arbitrary computer. In addition, those skilled in the art can understand that various modification examples can be made to the implementation method and the apparatus.

Figure 1:
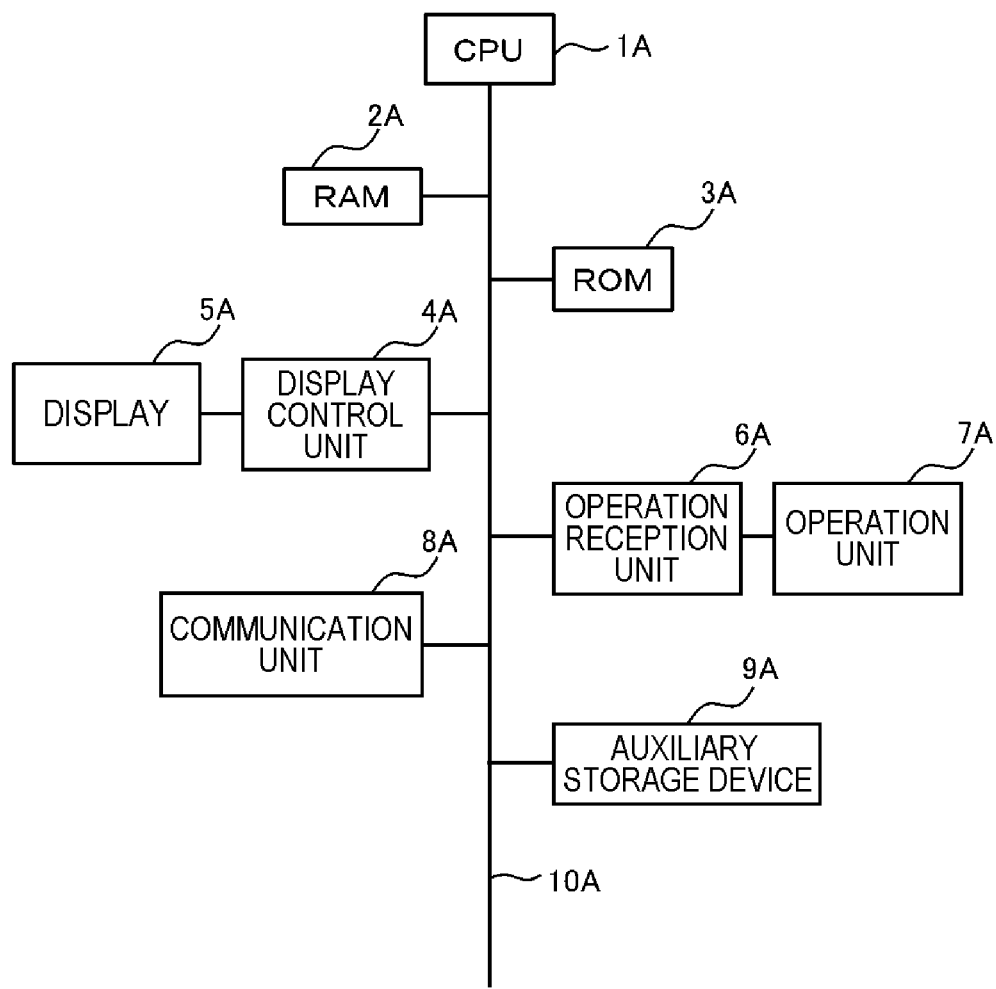
FIG. 1 is a conceptual diagram illustrating an example of a hardware configuration of an apparatus according to this example embodiment.

FIG. 1 is a conceptual diagram illustrating an example of a hardware configuration of an apparatus (inference apparatus) according to this example embodiment. As shown in the drawing, the apparatus according to this example embodiment includes, for example, a CPU 1A, a random access memory (RAM) 2A, a read only memory (ROM) 3A, a communication unit 8A, an auxiliary storage device 9A, and the like which are connected to each other by a bus 10A. Note that the apparatus (inference apparatus) according to this example embodiment may further include a display control unit 4A, a display 5A, an operation reception unit 6A, an operation unit 7A, and the like. Although not shown in the drawing, the apparatus according to this example embodiment may also include other components such as a microphone and a speaker. In addition, the apparatus is not required to include some of the components shown in the drawing.

The CPU 1A controls the overall computer of the apparatus together with the components. The ROM 3A includes an area in which programs for operating the computer, various application programs, various pieces of setting data used during the operation of the programs, and the like are stored. The RAM 2A includes an area, such as a work area for the operation of the programs, which transitorily stores data. The auxiliary storage device 9A is, for example, a hard disc drive (HDD) capable of storing large-capacity data.

The display 5A is, for example, a display device (a light emitting diode (LED) indicator, a liquid crystal display, an organic electro luminescence (EL) display, or the like). The display 5A may be a touch panel display integrated with a touch pad. The display control unit 4A reads data stored in a video RAM (VRAM), performs predetermined processing on the read data, and transmits the processed data to the display 5A, thereby displaying various screens. The operation reception unit 6A receives various operations through the operation unit 7A. The operation unit 7A includes an operation key, an operation button, a switch, a jog dial, a touch panel display, a keyboard, and the like. The communication unit 8A is connected to a network, such as the Internet or a local area network (LAN), in a wired and/or wireless manner to communicate with other electronic apparatuses. In addition, the communication unit 8A may be directly connected to another electronic apparatus in a wired and/or wireless manner for communication.

Hereinafter, the present embodiment will be described. Note that functional block diagrams used in describing the following embodiment show function-based blocks rather than hardware-based configurations. In the functional block diagrams, although a description is given such that each apparatus is implemented by one piece of equipment, the implementation means therefor is not limited thereto. In other words, each apparatus may be configured to be physically or logically separated. It should be noted that the same components will be denoted by the same reference numerals and signs, and a description thereof will not be repeated.

First Example Embodiment

First, an outline of the present example embodiment will be described. The information providing apparatus according to this example embodiment determines the reliability of an operation state (inference result) of a monitored electric device group. The operation state is obtained by performing an inference on the basis of time-series measurement data and training data. The time-series measurement data includes any one of current consumption and power consumption of the monitored electric device group, and the training data associates a feature value of each operation state with each of a plurality of operation states that may be assumed by the monitored electric device group.

The information providing apparatus outputs information related to the determined reliability. For example, the information providing apparatus is capable of notifying of a reliability lower than a predetermined level, a time slot during which the reliability is lower than the predetermined level, or an inference result during the time slot during which the reliability is lower than the predetermined level. The information providing apparatus is further capable of displaying the reliability and the inference result on a graph along a time axis, and highlighting the time slot during which the reliability is lower than the predetermined level in the graph.

According to such an information providing apparatus of the present example embodiment, a user can easily recognize an output of an inference result indicating a reliability lower than the predetermined level. In addition, the user can easily grasp a time slot during which an inference result indicating a reliability lower than the predetermined level has been outputted, grasp the inference result itself indicating a reliability lower than the predetermined level, and the like.

The user having recognized an output of an inference result indicating a reliability lower than the predetermined level can understand that the setting for making an inference, for example, preparation of the training data has not been sufficiently performed. The user may then perform appropriate processing for increasing the reliability of an inference result, for example, by adding further training data. In addition, the user can determine an insufficiently set location of the training data on the basis of the time slot during which the inference result was outputted indicating a reliability lower than the predetermined level, the inference result itself, and the like. For example, it is possible to easily identify insufficient training data by identifying an electric device which was used during the time slot, during which the inference result was outputted, indicating the reliability lower than the predetermined level through an interview or the like with a user of the electric device.

Figure 2:
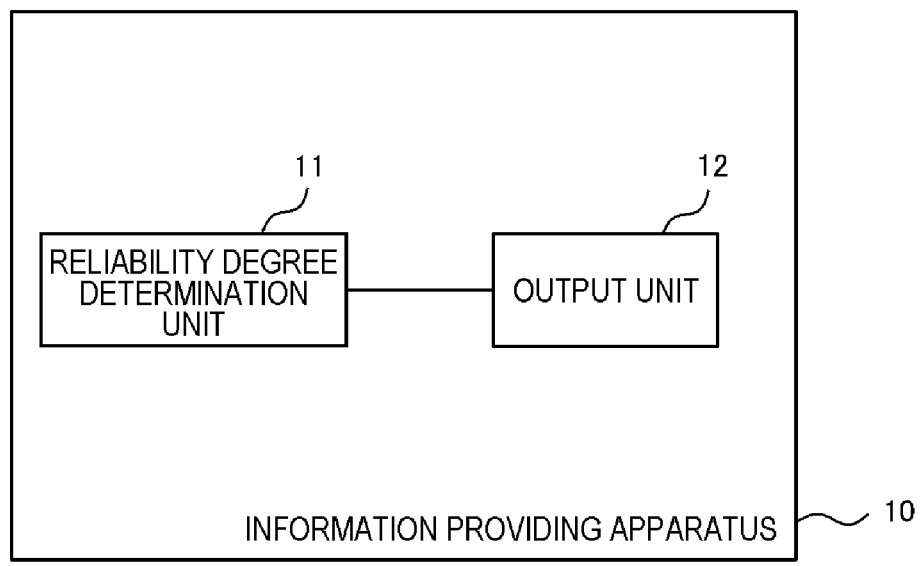
FIG. 2 illustrates an example of a functional block diagram of an information providing apparatus according to this example embodiment.

Next, a configuration of the information providing apparatus according to this example embodiment will be described. FIG. 2 illustrates an example of a functional block diagram of an information providing apparatus 10 according to this example embodiment. As shown in the drawing, the information providing apparatus 10 according to this example embodiment includes a reliability determination unit 11 and an output unit 12.

The reliability determination unit 11 determines the reliability of an inference result (operation state of a monitored electric device group), the inference result obtained by performing an inference on the basis of time-series measurement data and training data, the time-series measurement data including any one of current consumption and power consumption of the monitored electric device group and the training data associating each of a plurality of the operation states which can be assumed by the monitored electric device group with a feature value of each of the plurality of operation states.

First, details of the inference result and a method of generating the inference result will be described. The inference result is generated by an inference unit (not shown in FIG. 1). The inference unit infers an operation state of the monitored electric device group on the basis of time-series measurement data and training data, the time-series measurement data including any one of current consumption and power consumption of the monitored electric device group and the training data associating each of a plurality of the operation states which can be assumed by the monitored electric device group with a feature value of each of the plurality of operation states. Inference processing performed by the inference unit can be implemented by applying any conventional technique (for example, means disclosed in Patent Document 1). One example will be described below.

First, when the inference unit acquires pieces of the time-series measurement data including any one of current consumption and power consumption of the monitored electric device group, the inference unit sequentially sets the pieces of the time-series measurement data having a predetermined time width as processing data and extracts a predetermined feature value from each piece of the processing data.

The time-series measurement data is instantaneous waveform data (waveform data based on an AC frequency) which is measured by a measurement sensor installed at any position such as a distribution board, an electric outlet, or a table tap.

A plurality of electric devices that are connected to an interconnect on a downstream side of the installation position of the measurement sensor and receive the supply of power serve as one monitored electric device group. By measuring current (A) and power (W) at the installation position of the sensor, it is possible to measure current consumption (A) and power consumption (W) of the monitored electric device group that receives the supply of power on a downstream side of the installation position of the sensor.

Various feature values are extracted from the time-series measurement data, examples thereof including a frequency intensity and a phase (harmonic component) of the current consumption, a phase, a change in the current consumption, an average value, a peak value, an effective value, a wave height rate, a waveform rate, a convergence time of a change in current, an electrification time, the position of a peak, a time difference between a peak position of a power supply voltage and a peak position of the current consumption, a power factor, and the like. It should be noted that the invention is not limited thereto.

The inference unit may extract one type of feature value from the time-series measurement data, or may extract a plurality of types of feature values.

After the predetermined feature value is extracted, the inference unit infers an operation state of the monitored electric device group on the basis of the extracted feature value.

As illustrated in FIG. 3, a feature value (training data) of each of the monitored electric devices included in the monitored electric device group is registered in the inference unit in advance. The feature value is a value obtained by quantifying a feature appearing in the time-series measurement data during operation of each monitored electric device. Each feature value for power consumption of each monitored electric device may be registered.

The inference unit obtains a feature value for each of a plurality of operation states which can be assumed by the monitored electric device group, on the basis of the feature value of each of the monitored electric devices, as illustrated in FIG. 3. Examples of the operation states which can be assumed by the monitored electric device group include "only the fixed-line phone in operation", "the fixed-line phone, the monitor, and the Personal Computer (PC) in operation", and the like. In a case where each feature value for power consumption of each monitored electric device is registered, examples of the operation states which can be assumed by the monitored electric device group include "the fixed-line phone in operation at ∘∘ W", "the fixed-line phone in operation at xx W", "the fixed-line phone in operation at xx W, the monitor in operation at ∆∆W, and the PC in operation at □□ W", and the like. By adding the feature values of the respective monitored electric devices as illustrated in FIG. 3, it is possible to obtain the above-described feature values of the respective operation states which can be assumed by the monitored electric device group.

In this manner, as illustrated in FIG. 4, it is possible to obtain training data associating each of a plurality of the operation states which can be assumed by the monitored electric device group with a feature value of each of the plurality of operation states.

The inference unit can generate an inference model by machine learning using such training data and input the feature value extracted from the time-series measurement data to the generated inference model to obtain an inference result (operation state of the monitored electric device group). The inference model may be obtained by using, for example, multiple regression analysis, a neural network, a hidden Markov model, and the like.

As a result of the above-described inference processing, result data associating the inference result with date and time information is obtained, as illustrated in FIG. 5. As illustrated in FIG. 5, the result data is data in which inference results per unit time (every 30 seconds in FIG. 5) are aligned in time series. In the result data, the feature value extracted from the time-series measurement data is further associated with each inference result per unit time. That is, each inference result is a result obtained by performing an inference on the basis of the associated feature value. According to the result data shown in FIG. 5, it can be understood that only the fixed-line phone was inferred as being in operation at ∘∘ W between 0:00:00 and 0:00:30 on Jul. 1, 2015.

The inference unit may be provided within the information providing apparatus 10, or may be provided within another apparatus which is logically separated from the information providing apparatus 10. In the latter case, the result data generated by the inference unit is inputted to the information providing apparatus 10 by using any means.

Referring back to FIG. 2, the reliability determination unit 11 acquires the result data (see FIG. 5) which is generated by the inference unit. The reliability determination unit 11 generates a reliability of the inference result. As describe above, the result data is data in which inference results per unit time are aligned in time series. The reliability determination unit 11 generates a reliability of each inference result per unit time. Although there are various means for generating the reliability, an example will be described below.

"First Example of Reliability Generation"

In a case where it is inferred that "the monitored electric device group is in an m-th operation state (1≤m≤n) among first to n-th operation states" on the basis of a feature value x which is extracted from time-series measurement data, the reliability determination unit 11 determines a probability of the feature value x relatively representing the m-th operation state among the first to n-th operation states, as the reliability. Hereinafter, details will be described.

The reliability determination unit 11 retains a probability density distribution function $P_n(x)$ of the feature value x in the n-th operation state. $P_n(x)$ denotes a normal distribution or a multivariate normal distribution. In a case of the multivariate normal distribution, it is assumed that x denotes a vector.

The reliability determination unit 11 calculates $T_m(x)$ on the basis of the following Expression (1), $T_m(x)$ denoting a reliability in a case where the m-th operation state is inferred on the basis of the feature value x:

$$T_{m(x)} = \frac{P_{m(x)}}{\sum_{a=1}^{n} P_{a(x)}} \qquad \text{Expression (1)}$$

"Second Example of Reliability Generation"

In the case of the first example of reliability generation, a probability of the feature value x "relatively" representing the m-th operation state among the first to n-th operation states was set as the reliability. In such case, a situation may occur in which the reliability itself is an unreliable value. Hereinafter, details will be described.

Figure 6:
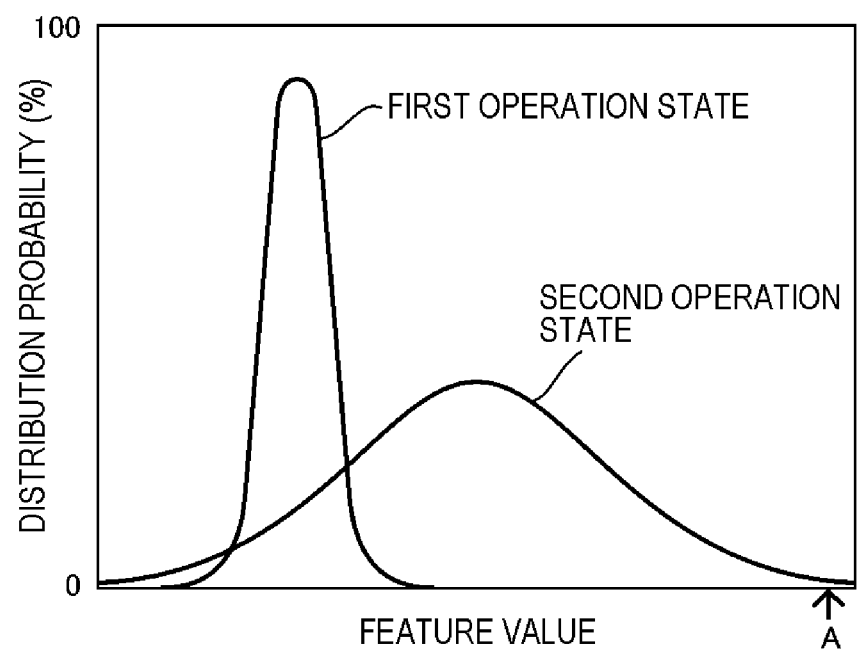
FIG. 6 is a diagram illustrating an example of reliability generation processing.

First, for convenience of description, it is assumed that the monitored electric device group takes two states of first and second operation states. FIG. 6 shows probability density distribution function of a feature value x in each of the first and second operation states. $P_1(A)$ denotes a probability distribution function of the feature value x in the first operation state, and $P_2(A)$ denotes a probability distribution function of the feature value x in the second operation state.

In this case, when the second operation state is inferred on the basis of a feature value A shown in the drawing, the reliability would be 100%. It should be noted that $P_1(A)=0$ and $P_2(A)>0$. However, as obvious from the drawing, the probability that the feature value A appears in the second operation state (value of $P_2(A)$) is not high by any means. Thus, it may not be preferable that the reliability of the inference result is set to 100%.

The first example of reliability generation was devised in a predetermined manner to provide the second example of reliability generation that is reduced in the disadvantage mentioned above.

Specifically, in a case where it is inferred that "the monitored electric device group is in the m-th operation state (1≤m≤n) among the first to n-th operation states" on the basis of the feature value x extracted from the time-series measurement data, the reliability determination unit 11 determines a reliability on the basis of a probability of the feature value x relatively representing the m-th operation state among the first to n-th operation states and a probability of the feature value x appearing in the m-th operation state. Hereinafter, details will be described.

The reliability determination unit 11 retains the probability density distribution function $P_n(x)$ of the feature value x in the n-th operation state. $P_n(x)$ denotes a normal distribution or a multivariate normal distribution. In a case of the multivariate normal distribution, it is assumed that x denotes a vector.

The reliability determination unit 11 calculates $T_m(x)$ on the basis of the following Expressions (2) to (4), $T_m(x)$ denoting a reliability in a case where the m-th operation state is inferred on the basis of the feature value x:

$$T_{m(x)} = P_{m1(x)} \times P_{m2(x)} \qquad \text{Expression (2)}$$

$$P_{m1(x)} = \frac{P_{m(x)}}{\sum_{a=1}^{n} P_{a(x)}} \qquad \text{Expression (3)}$$

$$P_{m2(x)} = 1 - (1 - P_{m(x)})^Q, \text{ (provided } 1 < Q) \qquad \text{Expression (4)}$$

Expression (4) is a correction expression for correcting a generated probability $P_m(x)$. $P_{m2}(x)$ denotes a probability of the feature value x appearing at least once out of Q times in the m-th operation state (hereinafter, "generated probability after correction").

Figure 7:
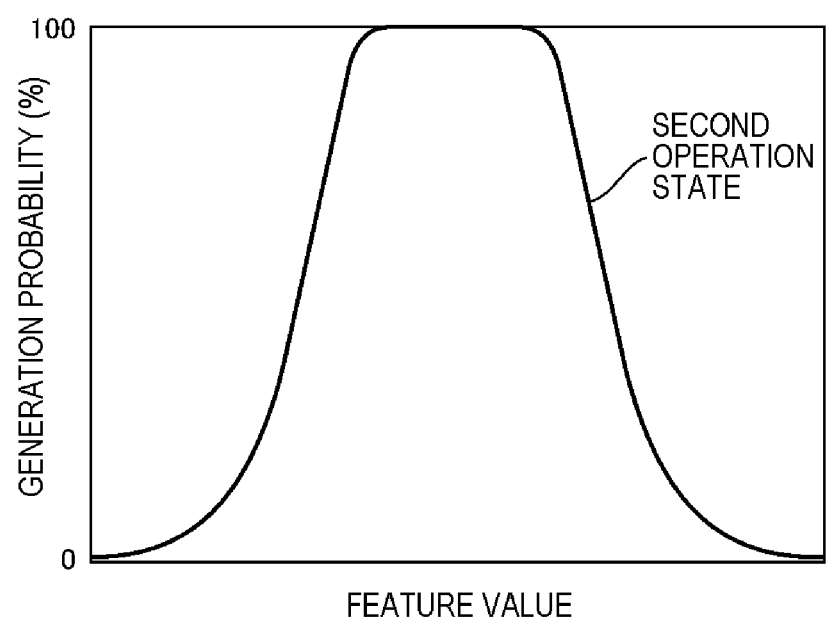
FIG. 7 is a diagram illustrating an example of the reliability generation processing.
Figure 8:
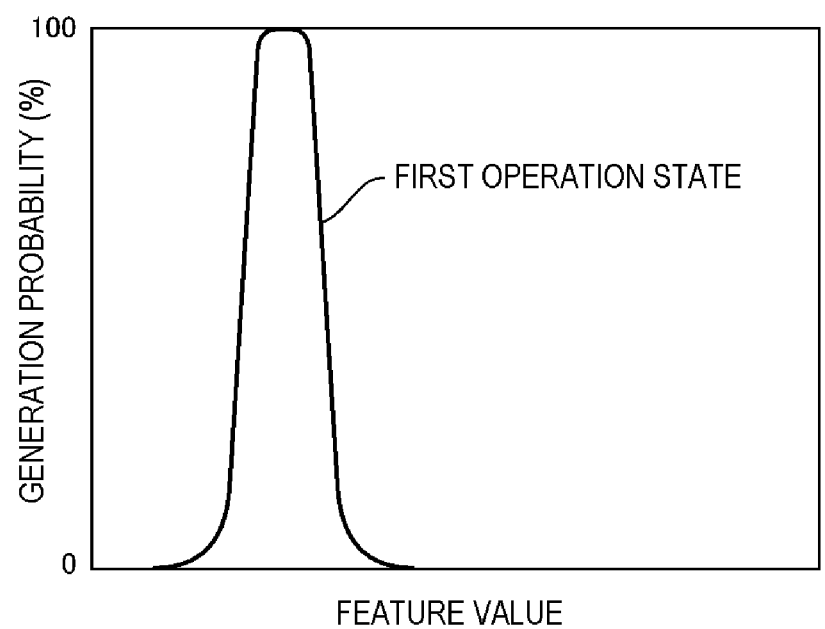
FIG. 8 is a diagram illustrating an example of the reliability generation processing.

When the probability density distribution functions in the first and second operation states illustrated in FIG. 6 are corrected by Expression (4), results as illustrated in FIGS. 7 and 8 are obtained.

As also obvious from FIGS. 6 and 7, it is possible to increase a probability (value) at a peak position and a probability (value) in the vicinity of the peak position by the correction based on Expression (4). In a case of the probability density distribution function in the second operation state before the correction which is illustrated in FIG. 6, the probability at the peak position is less than 50%. On the other hand, in a case of the probability density distribution function in the second operation state after the correction which is illustrated in FIG. 7, the probability (generated probability after correction) at the peak position is 100%.

In this manner, according to Expression (4), the probability (value) at the peak position and the probability (value) in the vicinity of the peak position can be increased, while the probability (value) can be maintained small at the base.

In a case of the example in which a product of $P_{m2}(x)$ and $P_{m1}(x)$ is set to be a reliability $T_m(x)$, $T_m(x)$ can be set to a large value in a case where a feature value at the peak position and a feature value in the vicinity thereof are extracted. On the other hand, in a case where a feature value around the base is extracted, $T_m(x)$ can be set to be a small value. That is, it is possible to generate a reliability on which a fact is reflected well.

Note that another value such as an average value of $P_{m1}(x)$ and $P_{m2}(x)$ may be set to $T_m(x)$, instead of Expression (2) in which the product of $P_{m1}(x)$ and $P_{m2}(x)$ is set to $T_m(x)$.

The reliability determination unit 11 can generate the reliability of an inference result by using, for example, the above-described means. As a result, for example, reliability data as illustrated in FIG. 9 can be obtained. In the reliability data, a date and time, an inference result, and a reliability are associated with each other. Note that the reliability is represented by a percentage in FIG. 9, but is not limited thereto. For example, an evaluation scale of 1 to 5 may be used, or another manner may be adopted.

Referring back to FIG. 2, the output unit 12 outputs information related to a reliability which is determined by the reliability determination unit 11. The output unit is not particularly limited, and can be implemented through any output apparatus such as a display, a printer, a mailer, or a speaker.

For example, the output unit 12 may output a time slot during which the reliability is lower than a predetermined level. When the reliability data illustrated in FIG. 9 is obtained, the output unit 12 may compare a value in the reliability column with a value indicating the predetermined level (for example, 30%), in order to determine a time slot with a lower reliability than the predetermined level. The output unit 12 may output the determined time slot as the time slot during which an inference result indicating a reliability lower than the predetermined level was obtained.

In the time slot in which an inference result indicating a reliability lower than the predetermined level was obtained, there is a possibility that an electric device having training data not set (registered) therein was connected and used. By conducting appropriate examination such as interviewing the power user focusing on the time slot, it is possible to identify the reason for the obtained inference result indicating a reliability lower than the predetermined level. It is possible to determine the necessity of maintenance (addition of training data, and the like) of an inference system, and the like on the basis of the identified reason. For example, executing addition of training data of a new electric device, warning the power user against the use of an inappropriate electric device, and the like may be considered.

In addition, the output unit 12 may output the inference result, the reliability, and the date and time in association with each other. The output unit 12 may display these pieces of data in time series. The output unit 12 may highlight the time slot during which the reliability is lower than the predetermined level. In this manner, the same effects as the above are obtained.

Figure 10:
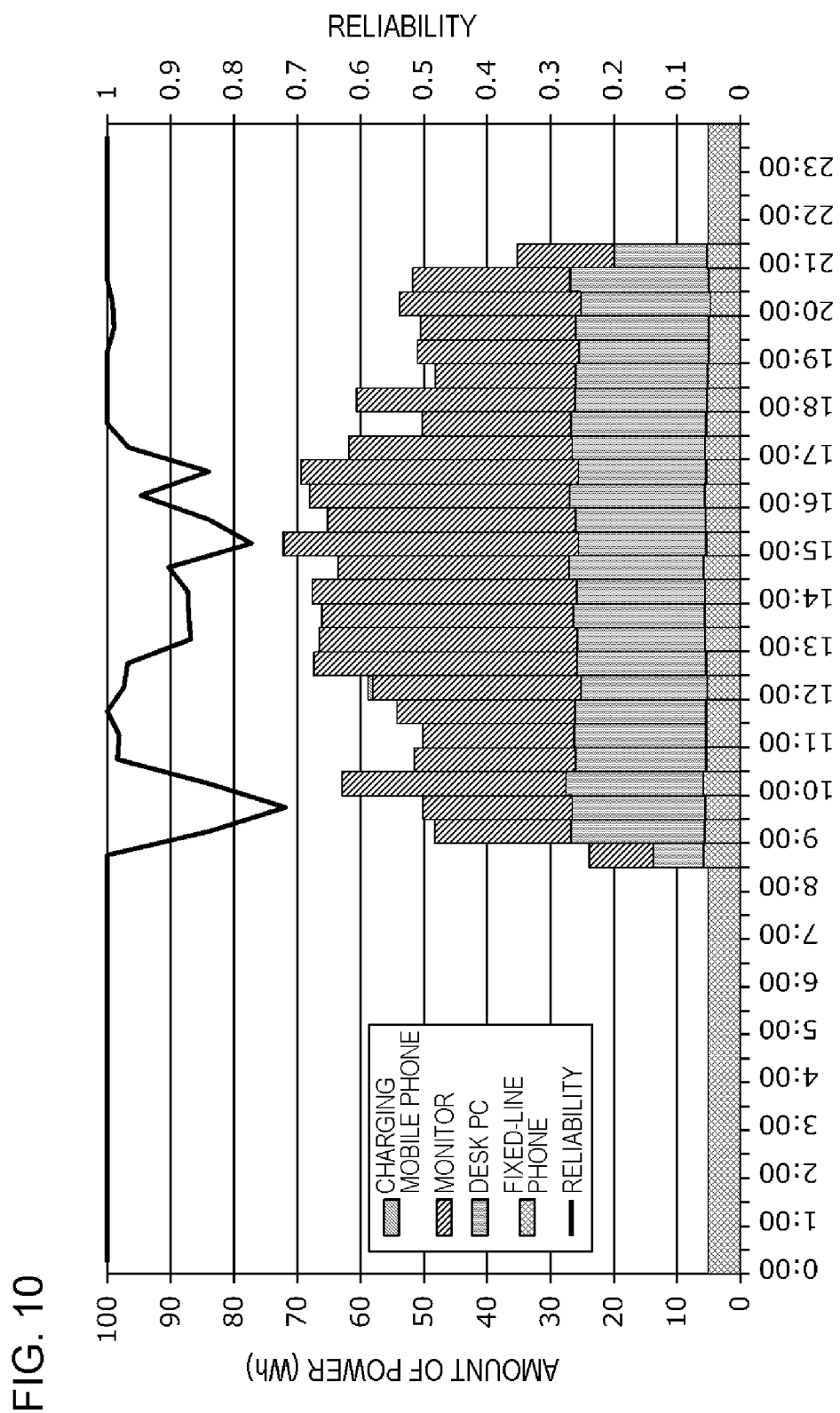
FIG. 10 is a diagram illustrating an example of output performed by on an output unit.

In addition, the output unit 12 may display monitored electric devices inferred to be in operation and the amount of power consumption or the amount of current consumption of each monitored electric device per unit time on the basis of inference results in a stacked graph with one axis (the horizontal axis in the drawing) representing a time axis and the other axis (the vertical axis in the drawing) representing the amount of power or the amount of current, for example, as illustrated in FIG. 10. The output unit 12 may superimposedly display the reliability of the inference result per unit time on the graph. In the case of FIG. 10, a reliability (value obtained by converting 100% into 1) is shown as a line graph.

In this manner, the same effects as the above are obtained. In addition, it is possible to easily recognize an inference result (operation state of the monitored electric device group) and temporal changes in the reliability of the inference result.

Figure 11:
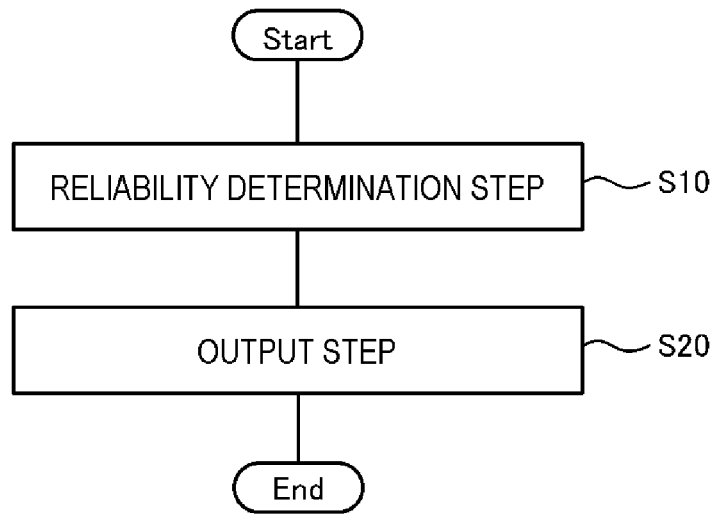
FIG. 11 is a flow chart illustrating an example of a flow of processing of the information providing apparatus according to this example embodiment.

Next, an example of a flow of processing of the information providing apparatus 10 according to the present example embodiment will be described with reference to a flow chart of FIG. 11.

In a reliability determination step S10, the reliability determination unit 11 determines the reliability of an inference result (operation state of the monitored electric device group) which is obtained by performing an inference on the basis of time-series measurement data and training data, the time-series measurement data including any one of current consumption and power consumption of the monitored electric device group and the training data associating each of a plurality of the operation states which can be assumed by the monitored electric device group with a feature value of each of the plurality of operation states.

In an output step S20, the output unit 12 outputs information related to the reliability.

According to this example embodiment described above, a user can easily recognize an output of an inference result indicating a reliability lower than a predetermined level, by viewing information related to the reliability provided by the information providing apparatus 10. In addition, the user can easily recognize a time slot during which the inference result indicating the reliability lower than the predetermined level is outputted, the inference result itself indicating the reliability lower than the predetermined level, and the like.

The user having recognized the output of the inference result indicating a reliability lower than the predetermined level can recognize that setting for the inference, for example, preparation of training data has been insufficient. Then, appropriate processing may be performed to increase the reliability of the inference result, for example, by adding training data. Further, the user can determine an insufficient setting location on the basis of the time slot during which an estimation result indicating a lower reliability than the predetermined level was outputted, the inference result itself, and the like. For example, it is possible to easily determine the insufficient training data, by identifying an electric device which was used in the time slot during which the inference result indicating a reliability lower than the predetermined level was outputted, through an interview with the user of the electric device.

In addition, the user, having recognized the time slot during which the inference result was outputted indicating a reliability lower than the predetermined level, can clarify the reason for the inference result indicating the low reliability by focusing on that time slot. For example, the user can carefully examine the inference result during the time slot in which the reliability was lower than the predetermined level, or can interview the power user about the use state of the electric device in the time slot during which the reliability is lower than the predetermined level. As a result, it is possible to efficiently understand the reason and to take countermeasures against the cause of the low reliability.

Second Example Embodiment

An information providing apparatus 10 according to this example embodiment is capable of totalizing inference results of a plurality of monitored electric device groups, collectively outputting operation states of the entire plurality of monitored electric device groups, and separately outputting reliabilities of the inference results of the respective monitored electric device groups. According to this example embodiment, a user can check the operation states (inference results) of all of the plurality of monitored electric device groups. On the other hand, the reliability of the inference result can be recognized for each monitored electric device group, and thus it is possible to easily determine the monitored electric device group in which an inference result indicating a reliability lower than a predetermined level has been generated. As a result, it is possible to easily narrow down the target monitored electric device group requiring consideration for maintenance and the like.

Next, a configuration of the information providing apparatus according to this example embodiment will be described. A functional block diagram of the information providing apparatus 10 according to this example embodiment is illustrated in FIG. 2, similar to the first example embodiment. As shown in the drawing, the information providing apparatus 10 according to this example embodiment includes a reliability determination unit 11 and an output unit 12.

The inference unit described in the first example embodiment infers an operation state for each monitored electric device group, and generates result data (see FIG. 5) associating the inference result for each monitored electric device group with date and time information.

For example, monitored electric devices receiving a supply of power from an electric outlet provided in the vicinity of Mr./Ms. A's desk within an office may be set as a first monitored electric device group, and monitored electric devices receiving a supply of power from an electric outlet provided in the vicinity of Mr./Ms. B's desk may be set as a second monitored electric device group. Alternatively, monitored electric devices receiving a supply of power from an electric outlet equipped to a first room may be set as a first monitored electric device group, and monitored electric devices receiving a supply of power from an electric outlet equipped to a second room may be set as a second monitored electric device group. This is just an example, and a method for dividing the monitored electric device groups can be desirably performed by adjusting an installation position of a measurement sensor that measures current consumption and power consumption. Further, a configuration of dividing the electric device groups according to branches of a distribution board may be adopted, instead of the configuration for dividing the electric device groups according to electric outlets.

The reliability determination unit 11 acquires result data (see FIG. 5) of each of the monitored electric device groups. The reliability is determined using the same method as that in the first example embodiment for each result data as a processing object to obtain reliability data (see FIG. 9) corresponding to each monitored electric device group.

The output unit 12 outputs predetermined information on the basis of the reliability data (see FIG. 9) related to each of the plurality of monitored electric device groups. For example, the output unit 12 may totalize inference results of operation states of each of the plurality of monitored electric device groups and output the inference results as operation states of all of the plurality of monitored electric device groups.

While the output unit 12 may collectively output the operation states of the plurality of monitored electric device groups, it may also separately (individually) output the reliabilities of the inference results of the plurality of monitored electric device groups. Hereinafter, an output example of the output unit 12 will be described with reference to the accompanying drawings.

Figure 12:
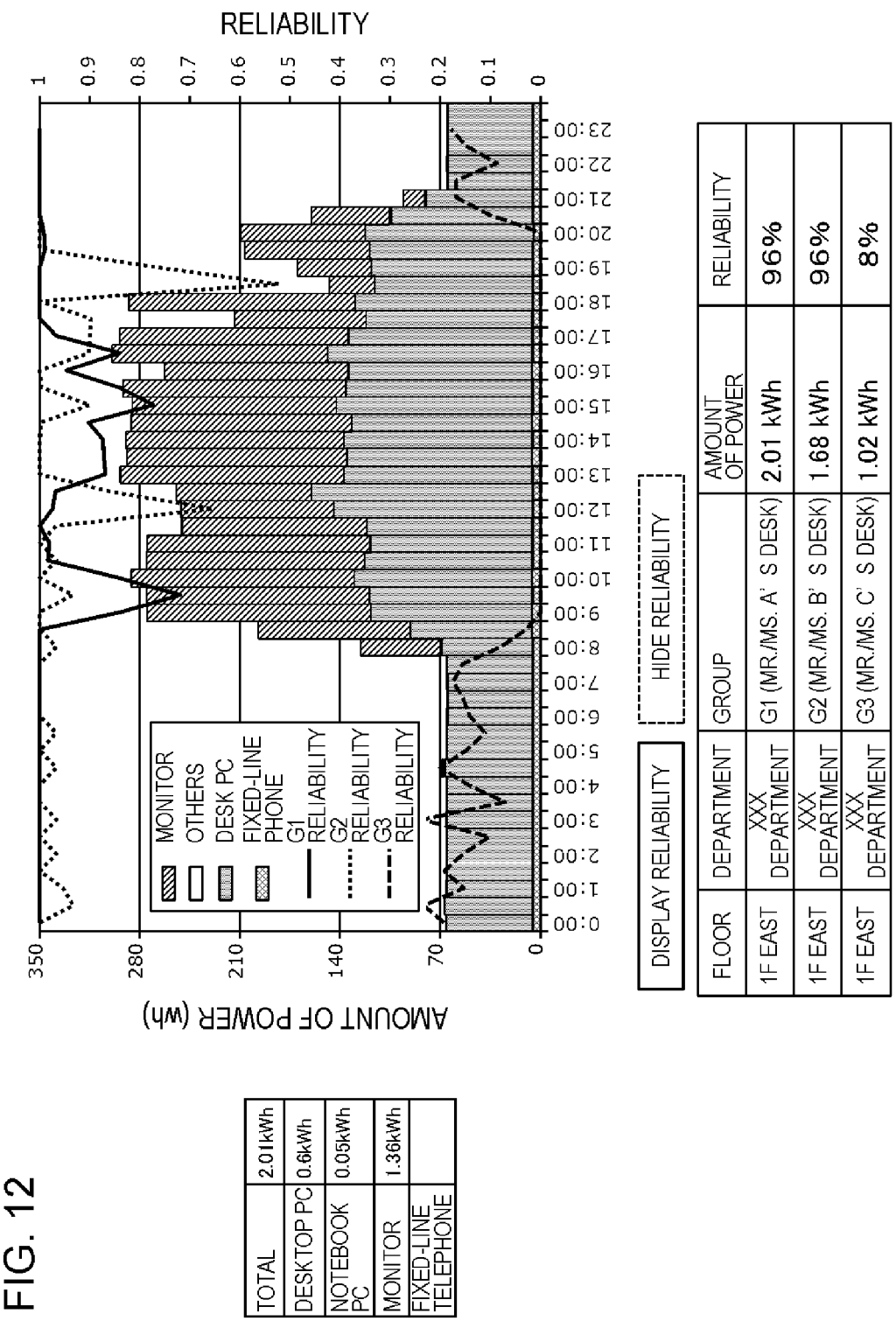
FIG. 12 is a diagram illustrating an example of output performed by the output unit.

FIG. 12 illustrates an output example of the output unit 12. In the drawing, monitored electric devices inferred as being in operation and the amount of power consumption or the amount of current consumption of each monitored electric device are displayed per unit time in a stacked graph with one axis (the horizontal axis in the drawing) representing a time axis and the other axis (the vertical axis in the drawing) representing the amount of power or the amount of current.

In the data shown in FIG. 12, totalization for adding power consumption and/or current consumption together is performed for each type of electric device (PC, fixed-line phone, monitor, and the like) with respect to inference results of operation states of the plurality of monitored electric device groups. The total power consumption and/or the total current consumption of various electric devices is shown.

Meanwhile, the output unit 12 separately (individually) outputs reliabilities of inference results of the plurality of monitored electric device groups.

It should be noted that the graph displays one day's worth of data but is not limited thereto. The table below the graph indicates the total value for each of the monitored electric device groups displayed as graph data (one day's worth of data in a case of the drawing).

In a case of the table, a first monitored electric device group corresponds to group G1, a second monitored electric device group corresponds to group G2, and a third monitored electric device group corresponds to group G3. It can be understood that the first monitored electric device group is positioned on the first floor, east section and corresponds to a plurality of monitored electric devices receiving a supply of power near Mr./Ms. A's desk (for example, from a predetermined electric outlet near Mr./Ms. A) who belongs to the XXX department.

Each power amount in the table is an average power consumption amount of each monitored electric device group. The reliability in the table is an average reliability (for example, a geometric average) of each monitored electric device group.

As shown in FIG. 12, the information providing apparatus 10 may be configured such that input units (for example, GUI parts) corresponding to each of "Display Reliability" and "Hide Reliability" are selectably provided. In a case of the example shown in the drawing, the selected input unit is framed by a solid line, and the unselected input unit is framed by a dashed line.

In a case where "Display Reliability" is selected as shown in the drawing, data of the reliability may be displayed in the graph. Although not shown in the drawing, in a case where "Hide Reliability" is selected, the data of the reliability in the graph may be in a non-displayed state. The input unit corresponding to "Display Reliability" shown in the drawing is a unit that receives a selection to separately output the reliabilities of the plurality of monitored electric device groups. Thus, as shown in the drawing, the reliabilities of the plurality of monitored electric device groups (G1 to G3) are separately displayed in the graph.

Figure 13:
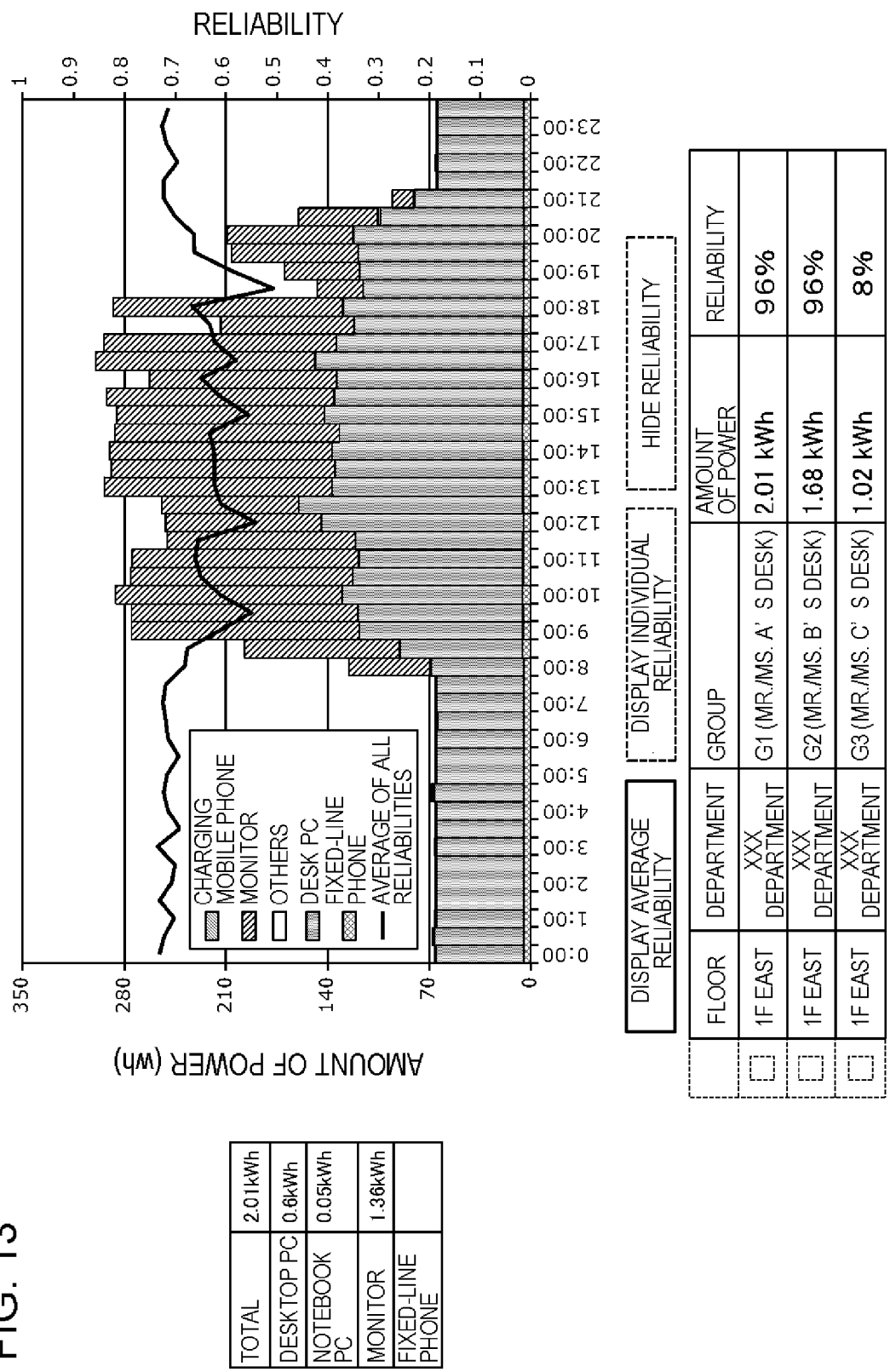
FIG. 13 is a diagram illustrating an example of output performed by the output unit.

In addition, the output unit 12 may totalize the reliabilities of the inference results of the plurality of monitored electric device groups and may collectively display the totalized reliabilities in the graph. For example, as illustrated in FIG. 13, the output unit 12 may display an average of the reliabilities of the inference results of the plurality of monitored electric device groups as a graph. In this case, as shown in the drawing, the information providing apparatus 10 may be configured such that input units (for example, GUI parts) corresponding to each of "Display Average Reliability", "Display Individual Reliability", and "Hide Reliability" is selectably provided. In a case of the example shown in the drawing, the selected input unit is framed by a solid line, and the unselected input units are framed by a dashed line.

In a case where "Display Average Reliability" is selected as shown in the drawing, an average of the reliabilities of the inference results of the plurality of monitored electric device groups may be displayed in a graph. Although not shown in the drawing, in a case where "Hide Reliability" is selected, the graphed reliability data may be set to be in a non-displayed state.

Note that input units (for example, GUI parts) which receive inputs for selecting each of the plurality of monitored electric device groups are displayed in the drawing so as to correspond to each of the plurality of monitored electric device groups. In a case where "Display Average Reliability" or "Hide Reliability" is selected, the input units are invalidated. In the drawing, the invalidated input units are shown by a dashed line.

Figure 14:
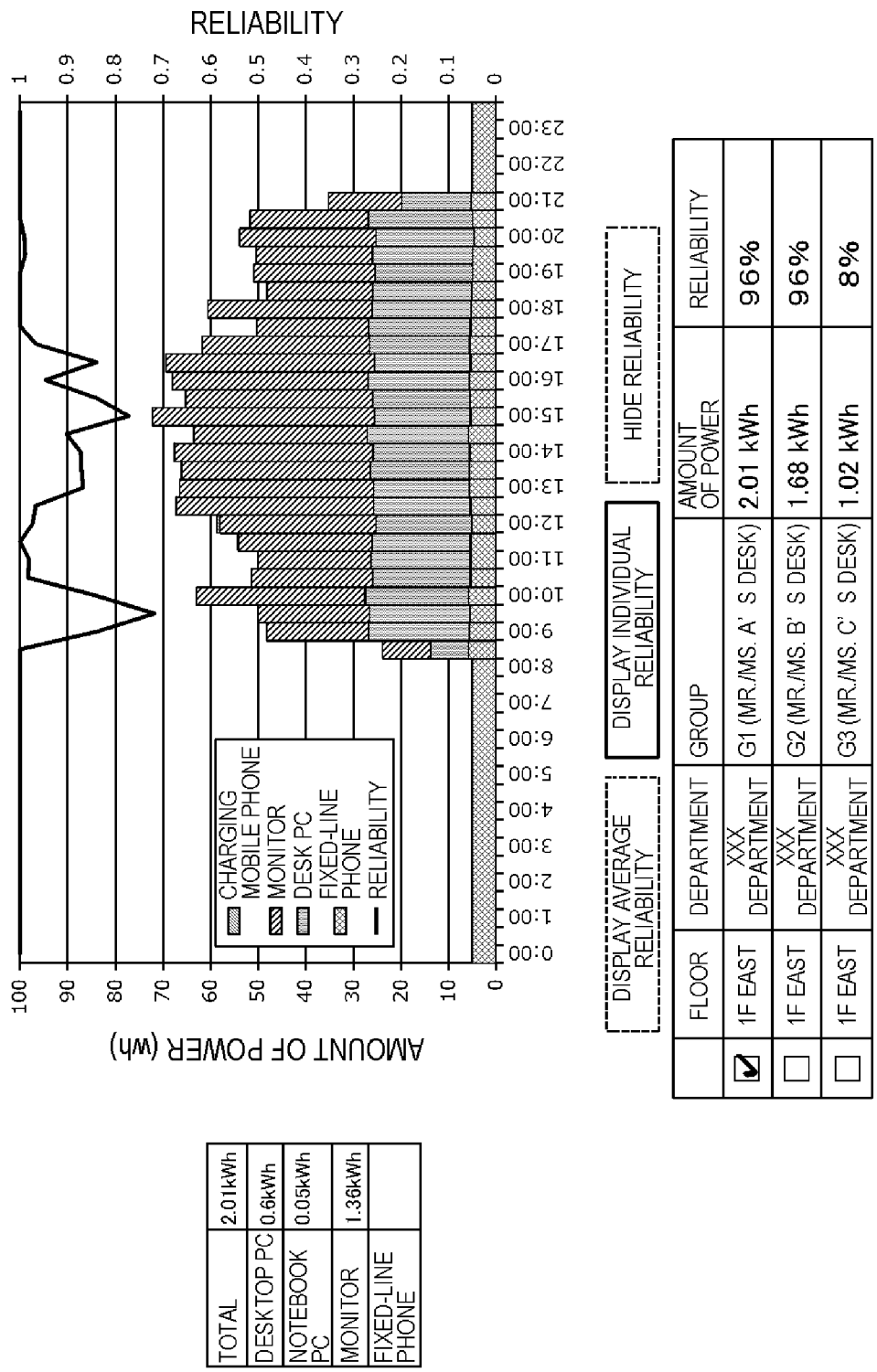
FIG. 14 is a diagram illustrating an example of output performed by the output unit.

In a case where "Display Individual Reliability" is selected as illustrated in FIG. 14, input units (for example, GUI parts) which receive inputs for selecting any one of the plurality of monitored electric device groups is validated. In the drawing, the validated input units are displayed by a solid line. In the drawing, the monitored electric device group corresponding to group G1 is selected. In a case where "Display Individual Reliability" is selected, data of the reliability of the selected monitored electric device group is displayed in the graph.

Figure 15:
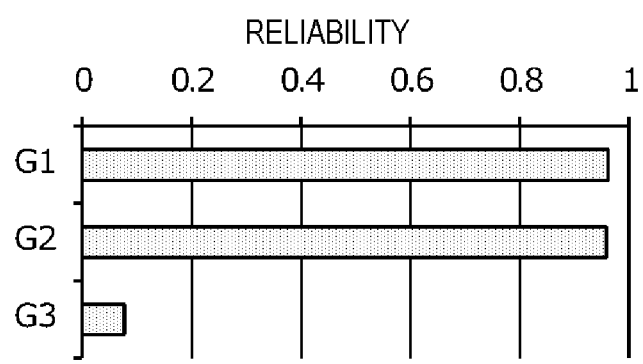
FIG. 15 is a diagram illustrating an example of output performed by the output unit.

In addition, the output unit 12 may output only the reliabilities of the inference results of the plurality of monitored electric device groups as illustrated in FIG. 15.

It should be noted that the reliability of the inference result may be in a non-displayed state. As described in the first example embodiment, the user checks whether or not the setting is sufficient, and the like, on the basis of the reliability of the inference result. Thus, for example, the apparatus may be set so that the reliability may be displayed only in a maintenance mode. For example, in screens illustrated in FIGS. 12 to 14, a Graphical User Interface (GUI) part for turning on or off the maintenance mode may be displayed to allow switching of the maintenance mode through the GUI part.

According to this example embodiment described above, it is possible to achieve the same advantageous effects as those in the first example embodiment.

In addition, the information providing apparatus 10 according to this example embodiment may collectively output the operation states of all of the plurality of monitored electric device groups, as well as separately output the reliabilities of the inference results of the respective monitored electric device groups. According to this example embodiment, a user can check the operation states (inference results) of all of the plurality of monitored electric device groups. Meanwhile, since the reliability of the inference result is outputted for each monitored electric device group, the monitored electric device group generated with an inference result indicating a reliability lower than a predetermined level is easily identified. As a result, it is possible to easily narrow down a target monitored electric device group requiring consideration for maintenance and the like.

Hereinafter, an example of a reference configuration will be appended.

1. An information providing apparatus including:

a reliability determination unit that determines a reliability of an inference result indicating an operation state of a monitored electric device group obtained by performing an inference on the basis of time-series measurement data and training data, the time-series measurement data including any one of current consumption and power consumption of the monitored electric device group and the training data associating each of a plurality of the operation states which can be assumed by the monitored electric device group with a feature value of each of the plurality of operation states; and an output unit that outputs information related to the reliability.

2. The information providing apparatus according to 1, wherein the inference result is associated with date and time information, and wherein the output unit outputs a time slot during which the reliability is lower than a predetermined level.

3. The information providing apparatus according to 2, wherein the output unit further outputs the inference result during the time slot during which the reliability is lower than the predetermined level.

4. The information providing apparatus according to 1 or 2, wherein the inference result is associated with the date and time information, and wherein the output unit outputs the inference result, the reliability, and the date and time in association with each other.

5. The information providing apparatus according to 4, wherein the output unit highlights a time slot during which the reliability is lower than the predetermined level.

6. The information providing apparatus according to 4 or 5, wherein the output unit displays monitored electric devices inferred as being in operation and a power consumption amount or a current consumption amount of each of the monitored electric devices per unit time on the basis of the inference result in a stacked graph with one axis representing a time axis and the other axis representing a power amount or a current amount, as well as displays the reliability of the inference result per unit time superimposed on the graph.

7. The information providing apparatus according to any one of 1 to 6,
wherein the output unit totalizes the inference result of the operation state of each of a plurality of the monitored electric device groups, outputs the totalized inference results as the operation states of the all of the plurality of monitored electric device groups, and outputs the reliability of the inference result of each of the plurality of monitored electric device groups separately from each other.

8. The information providing apparatus according to any one of 1 to 7, further including:
an input reception unit that receives a user input selecting to either separately output the reliabilities of the inference results of the plurality of monitored electric device groups or to output an average of the reliabilities,
wherein the output unit performs the output using an output method selected by the user input.

9. The information providing apparatus according to any one of 1 to 8, further including:
an input reception unit that receives a user input selecting any one of the plurality of monitored electric device groups,
wherein the output unit outputs the reliability of the inference result of the monitored electric device group selected by the user input.

10. The information providing apparatus according to any one of 1 to 9,
wherein when the monitored electric device group is inferred as being in an m-th operation state (1≤m≤n) among first to n-th operation states on the basis of a feature value x extracted from the time-series measurement data, the reliability determination unit determines a probability of the feature value x relatively representing the m-th operation state among the first to n-th operation states, as the reliability.

11. The information providing apparatus according to 10,
wherein when a probability density distribution function of the feature value x in the n-th operation state is set to $P_n(x)$ (provided $P_n(x)$ denotes a normal distribution or a multivariate normal distribution, and x denotes a vector when $P_n(x)$ denotes a multivariate normal distribution), the reliability determination unit calculates $T_m(x)$ on the basis of Expression (1) above, $T_m(x)$ being the reliability when the m-th operation state is inferred on the basis of the feature value x.

12. The information providing apparatus according to any one of 1 to 9,
wherein when the monitored electric device group is inferred as being in an m-th operation state (1≤m≤n) among first to n-th operation states on the basis of a feature value x extracted from the time-series measurement data, the reliability determination unit determines the reliability on the basis of a probability of the feature value x relatively representing the m-th operation state among the first to n-th operation states and a probability of the feature value x appearing in the m-th operation state.

13. The information providing apparatus according to 12,
wherein when a probability density distribution function of the feature value x in the n-th operation state is set to $P_n(x)$ (provided $P_n(x)$ denotes a normal distribution or a multivariate normal distribution, and x denotes a vector when $P_n(x)$ denotes a multivariate normal distribution), the reliability determination unit calculates $T_m(x)$ on the basis of Expressions (2) to (4) above, $T_m(x)$ being the reliability when the m-th operation state is inferred on the basis of the feature value x.

14. An information providing apparatus including:
an output unit that outputs a reliability of an inference result indicating an operation state of a monitored electric device group, the inference result obtained by performing an inference on the basis of time-series measurement data and training data, the time-series measurement data including any one of current consumption and power consumption of the monitored electric device group and the training data associating each of a plurality of the operation states which can be assumed by the electric device group with a feature value of each of the plurality of operation states.

15. The information providing apparatus according to 14, further including:
an input reception unit that receives a selection of any one of a plurality of the monitored electric device groups,
wherein the output unit outputs the reliability of the selected monitored electric device group.

16. The information providing apparatus according to 14, further including:
an input reception unit that receives a selection to separately output the reliabilities of the plurality of monitored electric device groups,
wherein the output unit outputs the reliability of each of the plurality of monitored electric device groups separately from each other.

17. The information providing apparatus according to 14, further including:
an input reception unit that receives a selection to output an average of the reliabilities of the plurality of monitored electric device groups,
wherein the output unit outputs the average of the reliabilities of the plurality of monitored electric device groups.

18. An information providing method executed by a computer, the method including:
a reliability determination step of determining a reliability of an inference result indicating an operation state of a monitored electric device group, the inference result obtained by performing an inference on the basis of time-series measurement data and training data, the time-series measurement data including any one of current consumption and power consumption of the monitored electric device group and the training data associating each of a plurality of the operation states which can be assumed by the electric device group with a feature value of each of the plurality of operation states; and
an output step of outputting information related to the reliability.

18-2. The information providing method according to 18,
wherein the inference result is associated with date and time information, and
wherein the output step includes outputting a time slot during which the reliability is lower than a predetermined level.

18-3. The information providing method according to 18-2,
wherein the output step includes further outputting the inference result during the time slot during which the reliability is lower than the predetermined level.

18-4. The information providing method according to 18 or 18-2,
wherein the inference result is associated with the date and time information, and
wherein the output step includes outputting the inference result, the reliability, and the date and time in association with each other.

18-5. The information providing method according to 18-4,
wherein the output step includes highlighting the time slot during which the reliability is lower than the predetermined level.

18-6. The information providing method according to 18-4 or 18-5,
wherein the output step includes displaying monitored electric devices inferred as being in operation and a power consumption amount or a current consumption amount of each of the monitored electric devices per unit time on the basis of the inference result in a stacked graph with one axis representing a time axis and the other axis representing a power amount or a current amount, as well as displaying the reliability of the inference result per unit time superimposed on the graph.

18-7. The information providing method according to any one of 18 to 18-6,
wherein the output step includes totalizing the inference result of the operation state of each of a plurality of the monitored electric device groups, outputting the totalized inference results as the operation states of the all of the plurality of monitored electric device groups, and outputting the reliability of the inference result of each of the plurality of monitored electric device groups separately from each other.

18-8. The information providing method executed by a computer according to any one of 18 to 18-7, further including:
an input reception step of receiving a user input selecting to either separately output the reliabilities of the inference results of the plurality of monitored electric device groups or to output an average of the reliabilities,
wherein the output step includes outputting using an output method selected by the user input.

18-9. The information providing method executed by a computer according to any one of 18 to 18-8, further including:
an input reception step of receiving a user input selecting any one of the plurality of monitored electric device groups,
wherein the output step includes outputting the reliability of the inference result of the monitored electric device group selected by the user input.

18-10. The information providing method according to any one of 18 to 18-9,
wherein when the monitored electric device group is inferred as being in an m-th operation state ($1 \leq m \leq n$) among first to n-th operation states on the basis of a feature value x extracted from the time-series measurement data, the reliability determination step includes determining a probability of the feature value x relatively representing the m-th operation state among the first to n-th operation states, as the reliability.

18-11. The information providing method according to 18-10,
wherein when a probability density distribution function of the feature value x in the n-th operation state is set to $P_n(x)$ (provided $P_n(x)$ denotes a normal distribution or a multivariate normal distribution, and x denotes a vector when $P_n(x)$ denotes a multivariate normal distribution), the reliability determination step includes calculating $T_m(x)$ on the basis of Expression (1) above, $T_m(x)$ being the reliability when the m-th operation state is inferred on the basis of the feature value x.

18-12. The information providing method according to any one of 18 to 18-9,
wherein when the monitored electric device group is inferred as being in an m-th operation state ($1 \leq m \leq n$) among first to n-th operation states on the basis of a feature value x extracted from the time-series measurement data, the reliability determination step includes determining the reliability on the basis of a probability of the feature value x relatively representing the m-th operation state among the first to n-th operation states and a probability of the feature value x appearing in the m-th operation state.

18-13. The information providing method according to 18-12,
wherein when a probability density distribution function of the feature value x in the n-th operation state is set to $P_n(x)$ (provided $P_n(x)$ denotes a normal distribution or a multivariate normal distribution, and x denotes a vector when $P_n(x)$ denotes a multivariate normal distribution), the reliability determination step includes calculating $T_m(x)$ on the basis of Expressions (2) to (4) above, $T_m(x)$ being the reliability when the m-th operation state is inferred on the basis of the feature value x.

19. A program causing a computer to function as:
a reliability determination unit that determines a reliability of an inference result indicating an operation state of a monitored electric device group, the inference result obtained by performing an inference on the basis of time-series measurement data and training data, the time-series measurement data including any one of current consumption and power consumption of the monitored electric device group and the training data associating each of a plurality of the operation states which can be assumed by the electric device group with a feature value of each of the plurality of operation states; and
an output unit that outputs information related to the reliability.

19-2. The program according to 19,
wherein the inference result is associated with date and time information, and
wherein the output unit outputs a time slot during which the reliability is lower than a predetermined level.

19-3. The program according to 19-2,
wherein the output unit further outputs the inference result during the time slot during which the reliability is lower than the predetermined level.

19-4. The program according to 19 or 19-2,
wherein the inference result is associated with the date and time information, and
wherein the output unit outputs the inference result, the reliability, and the date and time in association with each other.

19-5. The program according to 19-4,
wherein the output unit highlights the time slot during which the reliability is lower than the predetermined level.

19-6. The program according to 19-4 or 19-5,
wherein the output unit displays monitored electric devices inferred as being in operation and a power consumption amount or a current consumption amount of each of the monitored electric devices per unit time on the basis of the inference result in a stacked graph with one axis representing a time axis and the other axis representing a power amount or a current amount, as well as displays the reliability of the inference result per unit time superimposed on the graph.

19-7. The program according to any one of 19 to 19-6,
wherein the output unit totalizes the inference result of the operation state of each of a plurality of the monitored electric device groups, outputs the totalized inference results as the operation states of the all of the plurality of monitored electric device groups, and outputs the reliability of the inference result of each of the plurality of monitored electric device groups separately from each other.

19-8. The program according to any one of 19 to 19-7, causing the computer to further function as:

an input reception unit that receives a user input selecting to either separately output the reliabilities of the inference results of the plurality of monitored electric device groups or to output an average of the reliabilities, wherein the output unit performs the output using an output method selected by the user input.

19-9. The program according to any one of 19 to 19-8, causing the computer to further function as:

an input reception unit that receives a user input selecting any one of the plurality of monitored electric device groups, wherein the output unit outputs the reliability of the inference result of the monitored electric device group selected by the user input.

19-10. The program according to any one of 19 to 19-9, wherein when the monitored electric device group is inferred as being in an m-th operation state (1≤m≤n) among first to n-th operation states on the basis of a feature value x extracted from the time-series measurement data, the reliability determination unit determines a probability of the feature value x relatively representing the m-th operation state among the first to n-th operation states, as the reliability.

19-11. The program according to 19-10, wherein when a probability density distribution function of the feature value x in the n-th operation state is set to Pn(x) (provided Pn(x) denotes a normal distribution or a multivariate normal distribution, and x denotes a vector when Pn(x) denotes a multivariate normal distribution), the reliability determination unit calculates Tm(x) on the basis of Expression (1) above, Tm(x) being the reliability when the m-th operation state is inferred on the basis of the feature value x.

19-12. The program according to any one of 19 to 19-9, wherein when the monitored electric device group is inferred as being in an m-th operation state (1≤m≤n) among first to n-th operation states on the basis of a feature value x extracted from the time-series measurement data, the reliability determination unit determines the reliability on the basis of a probability of the feature value x relatively representing the m-th operation state among the first to n-th operation states and a probability of the feature value x appearing in the m-th operation state.

19-13. The program according to 19-12, wherein when a probability density distribution function of the feature value x in the n-th operation state is set to Pn(x) (provided Pn(x) denotes a normal distribution or a multivariate normal distribution, and x denotes a vector when Pn(x) denotes a multivariate normal distribution), the reliability determination unit calculates Tm(x) on the basis of Expressions (2) to (4) above, Tm(x) being the reliability when the m-th operation state is inferred on the basis of the feature value x.

20. An information providing method executed by a computer, the method including:

an output step of outputting a reliability of an inference result indicating an operation state of a monitored electric device group, the inference result obtained by performing an inference on the basis of time-series measurement data and training data, the time-series measurement data including any one of current consumption and power consumption of the monitored electric device group and the training data associating each of a plurality of the operation states which can be assumed by the electric device group with a feature value of each of the plurality of operation states.

20-2. The information providing method executed by a computer according to 20, further including:

an input reception step of receiving a selection of any one of a plurality of the monitored electric device groups, wherein the output step includes outputting the reliability of the selected monitored electric device group.

20-3. The information providing method according to 20, further including:

an input reception step of receiving a selection to separately output the reliabilities of the plurality of monitored electric device groups, wherein the output step includes separately outputting the reliabilities of the plurality of monitored electric device groups.

20-4. The information providing method according to 20, further including:

an input reception step of receiving a selection to output an average of the reliabilities of the plurality of monitored electric device groups, wherein the output step includes outputting the average of the reliabilities of the plurality of monitored electric device groups.

21. A program causing a computer to function as:

an output unit that outputs a reliability of an inference result indicating an operation state of a monitored electric device group, the inference result obtained by performing an inference on the basis of time-series measurement data and training data, the time-series measurement data including any one of current consumption and power consumption of the monitored electric device group and the training data associating each of a plurality of the operation states which can be assumed by the electric device group with a feature value of each of the plurality of operation states.

21-2. The program according to 21, causing the computer to further function as:

an input reception unit that receives a selection of any one of a plurality of the monitored electric device groups, wherein the output unit outputs the reliability of the selected monitored electric device group.

21-3. The program according to 21, causing the computer to further function as:

an input reception unit that receives a selection to separately output the reliabilities of the plurality of electric device groups, wherein the output unit outputs the reliability of each of the plurality of monitored electric device groups separately from each other.

21-4. The program according to 21, causing the computer to further function as:

an input reception unit that receives a selection to output an average of the reliabilities of the plurality of electric device groups, wherein the output unit outputs the average of the reliabilities of the plurality of monitored electric device groups.

The application is based on Japanese Patent Application No. 2015-173673 filed on Sep. 3, 2015, the content of which is incorporated herein by reference.

What is claimed is:

1. An information providing apparatus comprising:
a memory storing one or more instructions; and
a processor configured to execute the one more instructions to:
determine a reliability of an inference result, the inference result indicating an operation state, among a plurality of operation states, of a monitored electric device group; and output information related to the reliability,
  wherein the inference result is obtained by performing an inference based on time-series measurement data and training data,
  wherein the time-series measurement data comprises at least one of a current consumption value and a power consumption value of the monitored electric device group,
  wherein the training data associates each of the plurality of the operation states assumable by the monitored electric device group with a feature value of each of the plurality of operation states,
  wherein the inference result is associated with date and time information, and
  wherein the processor further outputs a time slot during which the reliability is lower than a predetermined level.

2. The information providing apparatus according to claim 1,
  wherein the processor further outputs the inference result during the time slot during which the reliability is lower than the predetermined level.

3. The information providing apparatus according to claim 1,
  wherein the inference result is associated with the date and time information, and
  wherein the processor further outputs the inference result, the reliability, and the date and time in association with each other.

4. The information providing apparatus according to claim 3,
  wherein the processor further highlights a time slot during which the reliability is lower than the predetermined level.

5. The information providing apparatus according to claim 3,
  wherein the processor further displays monitored electric devices inferred as being in operation and a power consumption amount or a current consumption amount of each of the monitored electric devices per unit time on the basis of the inference result in a stacked graph with one axis representing a time axis and the other axis representing a power amount or a current amount, as well as displays the reliability of the inference result per unit time superimposed on the graph.

6. The information providing apparatus according to claim 1,
  wherein the processor further totalizes the inference result of the operation state of each of a plurality of the monitored electric device groups, outputs the totalized inference results as the operation states of all of the plurality of monitored electric device groups, and outputs the reliability of the inference result of each of the plurality of monitored electric device groups separately from each other.

7. The information providing apparatus according to claim 1, wherein the processor further
  receives a user input selecting to either separately output the reliabilities of the inference results of the plurality of monitored electric device groups or to output an average of the reliabilities, and
  performs the output using an output method selected by the user input.

8. The information providing apparatus according to claim 1, wherein the processor further receives a user input selecting any one of the plurality of monitored electric device groups, and
  outputs the reliability of the inference result of the monitored electric device group selected by the user input.

9. The information providing apparatus according to claim 1,
  wherein when the monitored electric device group is inferred as being in an m-th operation state ($1 \leq m \leq n$) among first to n-th operation states on the basis of a feature value x extracted from the time-series measurement data, the processor further determines a probability of the feature value x relatively representing the m-th operation state among the first to n-th operation states, as the reliability.

10. The information providing apparatus according to claim 9,
  wherein when a probability density distribution function of the feature value x in the n-th operation state is set to $P_n(x)$ (provided $P_n(x)$ denotes a normal distribution or a multivariate normal distribution, and x denotes a vector when $P_n(x)$ denotes a multivariate normal distribution), the processor further calculates $T_m(x)$ on the basis of Expression (1), $T_m(x)$ being the reliability when the m-th operation state is inferred on the basis of the feature value x:

$$T_{m(x)} = \frac{P_{m(x)}}{\sum_{a=1}^{n} P_{a(x)}}. \qquad \text{Expression (1)}$$

11. The information providing apparatus according to claim 1,
  wherein when the monitored electric device group is inferred as being in an m-th operation state ($1 \leq m \leq n$) among first to n-th operation states on the basis of a feature value x extracted from the time-series measurement data, the processor further determines the reliability on the basis of a probability of the feature value x relatively representing the m-th operation state among the first to n-th operation states and a probability of the feature value x appearing in the m-th operation state.

12. The information providing apparatus according to claim 11,
  wherein when a probability density distribution function of the feature value x in the n-th operation state is set to $P_n(x)$ (provided $P_n(x)$ denotes a normal distribution or a multivariate normal distribution, and x denotes a vector when $P_n(x)$ denotes a multivariate normal distribution), the processor further calculates $T_m(x)$ on the basis of Expressions (2) to (4), $T_m(x)$ being the reliability when the m-th operation state is inferred on the basis of the feature value x:

$$T_{m(x)} = P_{m1(x)} \times P_{m2(x)} \qquad \text{Expression (2)}$$

$$P_{m1(x)} = \frac{P_{m(x)}}{\sum_{a=1}^{n} P_{a(x)}} \qquad \text{Expression (3)}$$

$$P_{m2(x)} = 1 - (1 - P_{m(x)})^Q, \text{ (provided } I < Q\text{).} \qquad \text{Expression (4)}$$

13. An information providing method executed by a computer, the method comprising:
  determining a reliability of an inference result, the inference result indicating an operation state, among a plurality of operation states, of a monitored electric device group; and
  outputting information related to the reliability, wherein the inference result is obtained by performing an inference based on time-series measurement data and training data,
  wherein the time-series measurement data comprises at least one of a current consumption value and a power consumption value of the monitored electric device group,
  wherein the training data associates each of the plurality of the operation states assumable by the monitored electric device group with a feature value of each of the plurality of operation states,
  wherein the inference result is associated with date and time information, and
  wherein the processor further outputs a time slot during which the reliability is lower than a predetermined level.

14. A non-transitory storage medium storing a program causing a computer to:
  determine a reliability of an inference result, the inference result indicating an operation state, among a plurality of operation states, of a monitored electric device group; and
  output information related to the reliability,
  wherein the inference result is obtained by performing an inference based on time-series measurement data and training data,
  wherein the time-series measurement data comprises at least one of a current consumption value and a power consumption value of the monitored electric device group, and
  wherein the training data associates each of the plurality of the operation states assumable by the monitored electric device group with a feature value of each of the plurality of operation states,
  wherein the inference result is associated with date and time information, and
  wherein the processor further outputs a time slot during which the reliability is lower than a predetermined level.

15. An information providing apparatus comprising:
  a memory storing one or more instructions; and
  a processor configured to execute the one more instructions to:
    determine a reliability of an inference result, the inference result indicating an operation state, among a plurality of operation states, of a monitored electric device group; and output information related to the reliability,
    wherein the inference result is obtained by performing an inference based on time-series measurement data and training data,
  wherein the time-series measurement data comprises at least one of a current consumption value and a power consumption value of the monitored electric device group,
  wherein the training data associates each of the plurality of the operation states assumable by the monitored electric device group with a feature value of each of the plurality of operation states,
  wherein the inference result is associated with the date and time information,
  wherein the processor further outputs the inference result, the reliability, and the date and time in association with each other, and
  wherein the processor further highlights a time slot during which the reliability is lower than the predetermined level.

16. An information providing method executed by a computer, the method comprising:
  determining a reliability of an inference result, the inference result indicating an operation state, among a plurality of operation states, of a monitored electric device group; and
  outputting information related to the reliability, wherein the inference result is obtained by performing an inference based on time-series measurement data and training data,
  wherein the time-series measurement data comprises at least one of a current consumption value and a power consumption value of the monitored electric device group,
  wherein the training data associates each of the plurality of the operation states assumable by the monitored electric device group with a feature value of each of the plurality of operation states,
  wherein the inference result is associated with the date and time information,
  wherein the method further comprising:
    outputting the inference result, the reliability, and the date and time in association with each other, and
    highlighting a time slot during which the reliability is lower than the predetermined level.

17. A non-transitory storage medium storing a program causing a computer to:
  determine a reliability of an inference result, the inference result indicating an operation state, among a plurality of operation states, of a monitored electric device group; and
  output information related to the reliability,
  wherein the inference result is obtained by performing an inference based on time-series measurement data and training data,
  wherein the time-series measurement data comprises at least one of a current consumption value and a power consumption value of the monitored electric device group,
  wherein the training data associates each of the plurality of the operation states assumable by the monitored electric device group with a feature value of each of the plurality of operation states,
  wherein the inference result is associated with the date and time information,
  wherein the program further causes the computer to:
    output the inference result, the reliability, and the date and time in association with each other, and
    highlight a time slot during which the reliability is lower than the predetermined level.

18. An information providing apparatus comprising:
a memory storing one or more instructions; and
a processor configured to execute the one more instructions to:
determine a reliability of an inference result, the inference result indicating an operation state, among a plurality of operation states, of a monitored electric device group; and output information related to the reliability,
wherein the inference result is obtained by performing an inference based on time-series measurement data and training data,
wherein the time-series measurement data comprises at least one of a current consumption value and a power consumption value of the monitored electric device group,
wherein the training data associates each of the plurality of the operation states assumable by the monitored electric device group with a feature value of each of the plurality of operation states,
wherein when the monitored electric device group is inferred as being in an m-th operation state ($1 \leq m \leq n$) among first to n-th operation states on the basis of a feature value x extracted from the time-series measurement data, the processor further determines the reliability on the basis of a probability of the feature value x relatively representing the m-th operation state among the first to n-th operation states and a probability of the feature value x appearing in the m-th operation state, and
wherein when a probability density distribution function of the feature value x in the n-th operation state is set to $P_n(x)$ (provided $P_n(x)$ denotes a normal distribution or a multivariate normal distribution, and x denotes a vector when $P_n(x)$ denotes a multivariate normal distribution), the processor further calculates $T_m(x)$ on the basis of Expressions (2) to (4), $T_m(x)$ being the reliability when the m-th operation state is inferred on the basis of the feature value x:

$$T_{m(x)} = P_{m1(x)} \times P_{m2(x)} \quad \text{Expression (2)}$$

$$P_{m1(x)} = \frac{P_{m(x)}}{\sum_{a=1}^{n} P_{a(x)}} \quad \text{Expression (3)}$$

$$P_{m2(x)} = 1 - (1 - P_{m(x)})^Q, \text{ (provided } I < Q). \quad \text{Expression (4)}$$

19. An information providing method executed by a computer, the method comprising:
determining a reliability of an inference result, the inference result indicating an operation state, among a plurality of operation states, of a monitored electric device group; and outputting information related to the reliability,
wherein the inference result is obtained by performing an inference based on time-series measurement data and training data,
wherein the time-series measurement data comprises at least one of a current consumption value and a power consumption value of the monitored electric device group,
wherein the training data associates each of the plurality of the operation states assumable by the monitored electric device group with a feature value of each of the plurality of operation states,
wherein when the monitored electric device group is inferred as being in an m-th operation state ($1 \leq m \leq n$) among first to n-th operation states on the basis of a feature value x extracted from the time-series measurement data, the processor further determines the reliability on the basis of a probability of the feature value x relatively representing the m-th operation state among the first to n-th operation states and a probability of the feature value x appearing in the m-th operation state, and
wherein when a probability density distribution function of the feature value x in the n-th operation state is set to $P_n(x)$ (provided $P_n(x)$ denotes a normal distribution or a multivariate normal distribution, and x denotes a vector when $P_n(x)$ denotes a multivariate normal distribution), the processor further calculates $T_m(x)$ on the basis of Expressions (2) to (4), $T_m(x)$ being the reliability when the m-th operation state is inferred on the basis of the feature value x:

$$T_{m(x)} = P_{m1(x)} \times P_{m2(x)} \quad \text{Expression (2)}$$

$$P_{m1(x)} = \frac{P_{m(x)}}{\sum_{a=1}^{n} P_{a(x)}} \quad \text{Expression (3)}$$

$$P_{m2(x)} = 1 - (1 - P_{m(x)})^Q, \text{ (provided } I < Q). \quad \text{Expression (4)}$$

20. A non-transitory storage medium storing a program causing a computer to:
determine a reliability of an inference result, the inference result indicating an operation state, among a plurality of operation states, of a monitored electric device group; and
output information related to the reliability,
wherein the inference result is obtained by performing an inference based on time-series measurement data and training data,
wherein the time-series measurement data comprises at least one of a current consumption value and a power consumption value of the monitored electric device group,
wherein the training data associates each of the plurality of the operation states assumable by the monitored electric device group with a feature value of each of the plurality of operation states,
wherein when the monitored electric device group is inferred as being in an m-th operation state ($1 \leq m \leq n$) among first to n-th operation states on the basis of a feature value x extracted from the time-series measurement data, the processor further determines the reliability on the basis of a probability of the feature value x relatively representing the m-th operation state among the first to n-th operation states and a probability of the feature value x appearing in the m-th operation state, and
wherein when a probability density distribution function of the feature value x in the n-th operation state is set to $P_n(x)$ (provided $P_n(x)$ denotes a normal distribution or a multivariate normal distribution, and x denotes a vector when $P_n(x)$ denotes a multivariate normal distribution), the processor further calculates $T_m(x)$ on the basis of Expressions (2) to (4), $T_m(x)$ being the reliability when the m-th operation state is inferred on the basis of the feature value x:

$$T_{m(x)} = P_{m1(x)} \times P_{m2(x)} \quad \text{Expression (2)}$$

$$P_{m1(x)} = \frac{P_{m(x)}}{\sum_{a=1}^{n} P_{a(x)}} \quad \text{Expression (3)}$$

$$P_{m2(x)} = 1 - (1 - P_{m(x)})^Q, \text{ (provided } I < Q). \quad \text{Expression (4)}$$

* * * * *